United States Patent [19]
Pierrat et al.

[11] Patent Number: 6,106,980
[45] Date of Patent: *Aug. 22, 2000

[54] METHOD AND APPARATUS TO ACCURATELY CORRELATE DEFECT COORDINATES BETWEEN PHOTOMASK INSPECTION AND REPAIR SYSTEMS

[75] Inventors: Christophe Pierrat; Baorui Yang, both of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/122,249

[22] Filed: Jul. 24, 1998

Related U.S. Application Data

[62] Division of application No. 08/857,620, May 16, 1997, Pat. No. 5,798,193.

[51] Int. Cl.[7] ...................................................... G03F 9/00
[52] U.S. Cl. ................................................. 430/5; 430/22
[58] Field of Search .......................... 430/5, 22; 382/144

[56] References Cited

U.S. PATENT DOCUMENTS

| | | | |
|---|---|---|---|
| 5,633,173 | 5/1997 | Bae | 438/16 |
| 5,757,480 | 5/1998 | Shimanaka | 356/237 |
| 5,773,180 | 6/1998 | Tomimatu | 430/22 |
| 5,798,193 | 8/1998 | Pierrat et al. | 430/5 |

*Primary Examiner*—S. Rosasco
*Attorney, Agent, or Firm*—Schwegman, Lundberg, Woessner & Kluth, P.A.

[57] ABSTRACT

A method and apparatus for calibrating the coordinate systems of photomask processing machines improves processing efficiency and the quality of resulting photomasks. A test pattern is printed on an unproductive area of the photomask. The test pattern is used to calibrate the coordinate system of each processing machine on which the photomask is mounted. Using the test pattern as a common reference point enables points located using one processing machine to be quickly and accurately found on a second processing machine. The test pattern is also used as a reference for other metrology measurements.

23 Claims, 5 Drawing Sheets

METHOD AND APPARATUS TO ACCURATELY CORRELATE DEFECT COORDINATES BETWEEN PHOTOMASK INSPECTION AND REPAIR SYSTEMS

This application is a divisional of U.S. patent application Ser. No. 08/857,620, filed May 16, 1997 (the '620 application) now U.S. Pat. No. 5,798,193. The '620 application is incorporated herein by reference.

FIELD OF THE INVENTION

The present invention relates in general to photomask manufacturing, and particularly to locating defects using photomask inspection, review and repair machines.

BACKGROUND OF THE INVENTION

In conventional photomask manufacturing processes, after a mask is written, developed and cleaned, it is normally inspected on a defect inspection machine and then, if defects are found, reviewed or repaired on a separate machine. Using conventional systems, the information of the photomask inspection such as the defect type and coordinates of the defect can be automatically transferred to the defect repair or review systems. Currently, there are three types of repair techniques: focused ion beam (FIB), far field laser repair which uses optical lenses, and the near field optical repair which uses a micro pipette to deliver the laser beam. Review of photomask defects is normally performed using an optical microscope.

The resolution and accuracy of the x-y translation stage on both inspection and repair machines individually can be as accurate as 5 nm to 10 nm. However, due to the possibility that the origin of the coordinate system encompassing an x-y translation stage is not recorded accurately, calibration between any pair of inspection and repair machines could be off by as much as 40 microns. As a result, using the location coordinates recorded on one machine to find the same defect or other particularized point on another machine may not in itself be enough to locate the point on the other machine. In some cases the defects found on the first machine can not be located by using the first machine's coordinates on the second machine, even when using the maximum field of view.

According to standard procedures, each repair technique has a distinct method to locate defects found on an inspection machine. For example, the FIB repair machine uses the Ga+ion beam to scan the mask surface, while the near field optical system uses an AFM to capture the image. The far field laser repair machine will use a lower magnification objective if it is necessary. Several problems arise when defects fall outside the field of view on the repair or review machine. In the case of an FIB repair machine, the Ga+beam could unnecessarily damage a large area of the mask surface. In addition, the repair/review process is more time consuming on both the FIB and the AFM machines when the operator has to scan for the defects instead of driving directly to the location. Certain types of defects, such as the clear extension or the Cr extension, with size less than 0.2 microns, can not be easily recognized with a low magnification microscope objective such as that used on a far field laser repair machine.

In many cases, the mask will be reviewed on an optical microscope after inspection in order to classify the defect type or to study the detail structure of the defects. Similar to the far field laser repair machine, it is normally very time consuming to find small defects which fall outside of the field of view. What is needed is a more accurate and efficient way to find defects with a mask repair or review device.

SUMMARY OF THE INVENTION

The present invention teaches a practical and accurate method for correlating the coordinate systems of independent photomask processing machines. The method of the present invention effectively creates a single coordinate system for the photomask regardless of which and how many processing machines are used. According to one embodiment of the present invention the method for correlating the coordinate systems of two or more photomask processing machines comprises writing a test pattern on a non-productive area of a photomask, mounting the photomask on the first photomask processing machine, automatically searching the test pattern, recording the test pattern in a default coordinate system, reinitializing the coordinate system to a reference point within the test pattern, and storing the location of each of a plurality of points (for example defects in the photomask). The locations of the points are measured relative to the reinitialized coordinate system of the photomask processing machine.

The photomask is then mounted on a second processing machine and its coordinate system is initialized to the same test pattern reference point. The plurality of points are then easily found by applying the stored locations to the initialized coordinate system of the second photomask processing machine. As a result, offset errors resulting from errors in recording the processing machine's origin, inconsistent photomask placement on the stages, reference placement errors caused by the operator or other sources are not a factor. Processing throughput is thereby improved because the operator no longer has to take additional time to scan the photomask on the second processing machine to locate points which are not at the same location in each coordinate system. The ability to accurately locate points also reduces the damage done to the photomask surface by the Ga+ion beam when using a focused ion beam photomask repair machine.

According to another embodiment, the test pattern contains at least one reference point at a known location. The photomask is mounted on the processing machine, the test pattern is automatically searched, the location of the reference point is recorded as (Xp, Yp). The locations of particular points (for example defects in the photomask) are identified and stored. The photomask is then mounted on a second machine for the next processing step, the machine is driven to reference point (Xp, Yp) and initialized, and then moved to position (-Xp, -Yp) and reinitialized. The stored point locations are again used to drive directly to the desired points.

In yet another embodiment, the coordinate system on each processing system is initialized by driving the respective photomask processing machine to the reference point at a known location (Xp, Yp) within the test pattern and calibrating the processing machine coordinate system such that the coordinates of the first reference point are (Xp, YP).

The test pattern and reference point are used for calibrating coordinate systems and may also be used as a reference for other metrologic tasks. In a further embodiment, multiple reference points are used to increase the accuracy of the calibration.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 1:
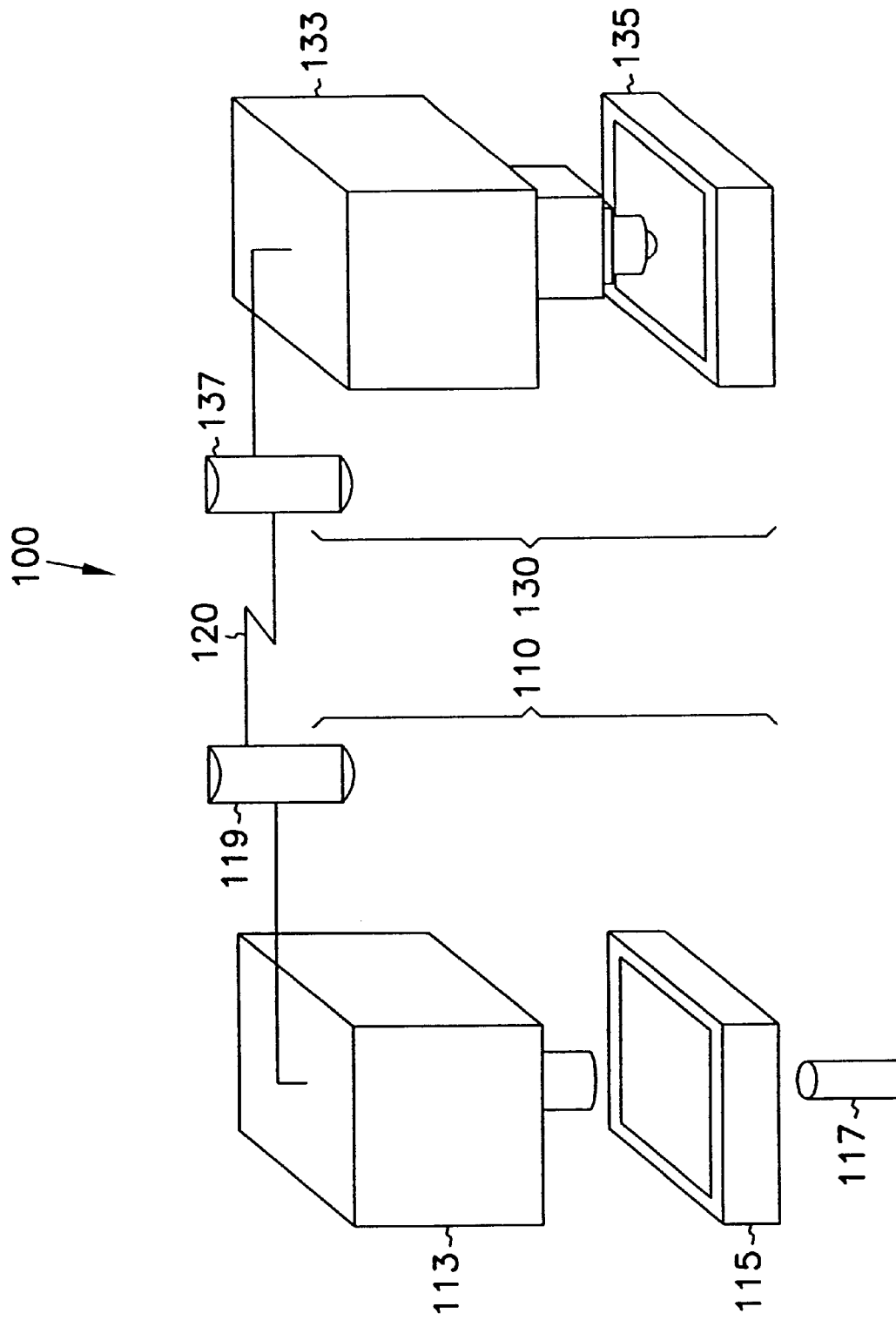
FIG. 1 is a block diagram of a system comprising a photomask inspection machine and a photomask repair machine.

With currently available technology, review and repair of a photomask requires at least two machines. FIG. 1 illustrates one such system, comprising a photomask inspection machine 110 and a photomask repair machine 130. In the example shown, a mask is mounted on the x-y stage 115 of the inspection machine 110, and illuminated by illuminator 117. The image sensor 113 contains microscope optics for viewing the mask. The x-y coordinates of each defect found by the image sensor 113 are measured and written to storage device 119. In one embodiment storage device 119 is a magnetic tape, but those skilled in the art will recognize that any data storage medium, including but not limited to tape, disk, or random access memory (RAM), can be used. After the entire mask has been examined, it is moved to repair system 130.

The defect location information, comprising the x-y coordinates of each defect found, is moved via communication path 120 to storage device 137 incorporated into the repair system 130. In one embodiment communication path 120 comprises a line for electronic data transfer between the systems. In another embodiment communication path 120 comprises removing the storage medium 119 from the inspection machine 110 and inserting it into repair machine 130. Those skilled in the art will recognize that any known data transfer method that is consistent with the data storage devices 119, 137 can be used without exceeding the spirit and scope of the present invention. The defect location information is then employed to attempt to locate each defect in terms of the repair machine's coordinate system.

Figure 2A:
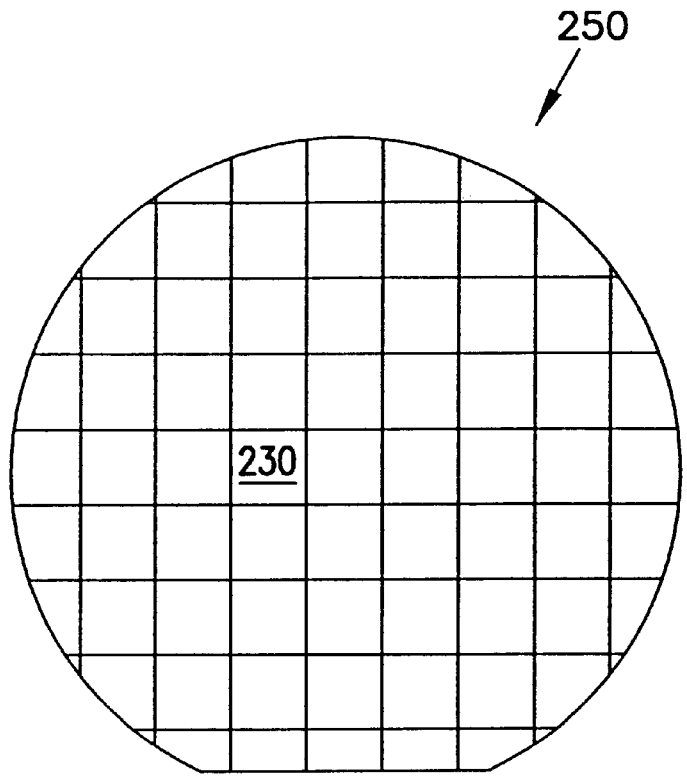
FIG. 2A is a schematic diagram illustrating a pattern of images printed on a wafer using a photolithographic process.
Figure 2B:
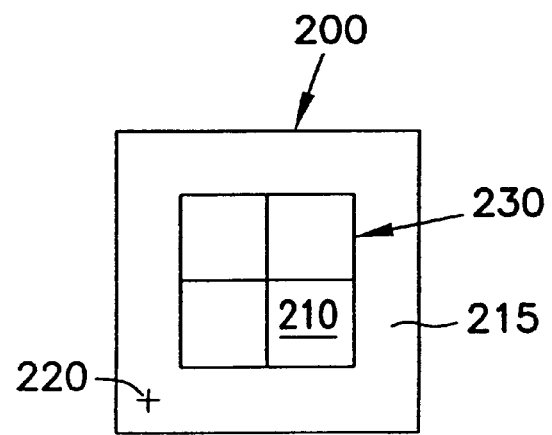
FIG. 2B is a schematic diagram illustrating four dies on a photomask used to print one or more of the images on the wafer shown in FIG. 2A.

FIG. 2A shows an example of a pattern of images printed on a wafer surface 250 using a photolithographic process. Each of the squares (e.g. 230) represents the pattern or patterns printed by a singe photomask. FIG. 2B shows one example of a photomask 200 used to print a pattern on the wafer surface 250. The productive area 230 of the photomask 200 comprises multiple images of the circuit pattern 210 imprinted on the center of the photomask so as to cover the entire surface of the silicon wafers to be masked. This leaves an unproductive area of the photomask 215 which is unused in conventional processing. According to one embodiment of the present invention at least one test pattern 220 is printed in the unproductive area 215. In one embodiment test pattern 220 is a particular symbol such as a series of concentric circles or a cross. In another embodiment test pattern 220 is a sample mask pattern with a known defect intentionally incorporated. In any event test pattern 220 has at least one identifiable center point. In an alternate embodiment, multiple programmed defects within one test pattern or multiple test patterns are used in order to more accurately calibrate the photomask on the machines.

Figure 3B:
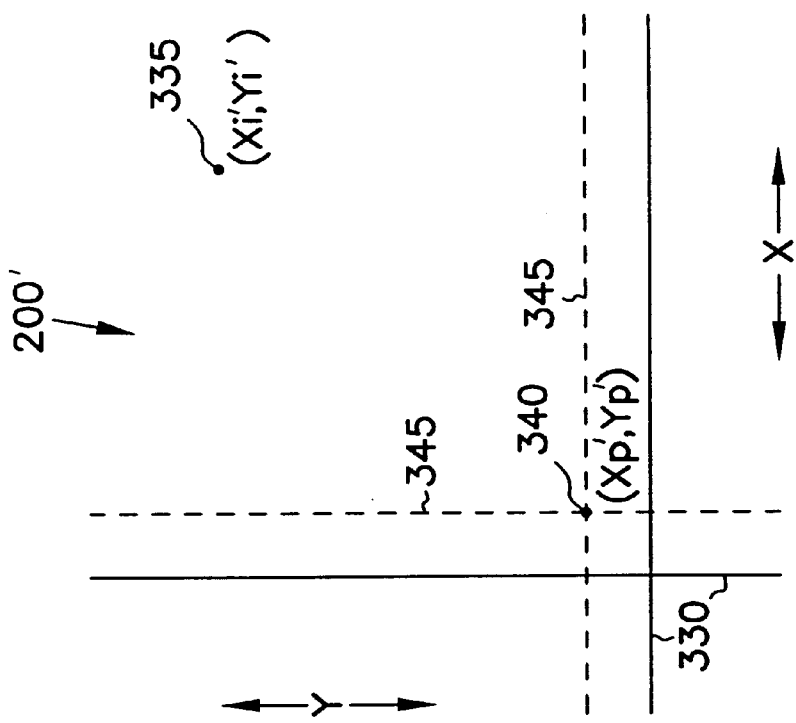
FIG. 3B is a graphical representation of the positioning of a photomask within the coordinate system of an inspection machine according to another embodiment of the present invention.
Figure 3A:
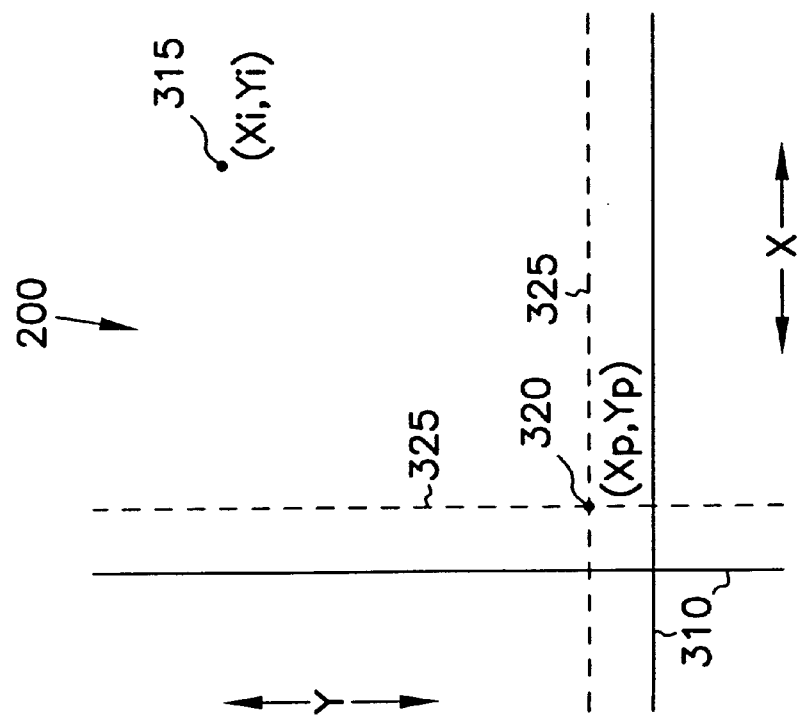
FIG. 3A is a graphical representation of the positioning of a photomask within the coordinate system of an inspection machine and a repair machine according to one embodiment of the present invention.

Once the photomask 200 is prepared, it must be inspected for defects, and any discovered defects reviewed and possibly corrected. Generally, two photomask processing machines are used to accomplish the process of inspection and correction. First, the photomask is mounted on an inspection machine 110 (FIG. 1). FIG. 3 illustrates one example of the positioning of a photomask 200 within the coordinate system of an inspection machine 110. Conventional systems mount the photomask in a precalibrated device 115. Then the location of each defect 315 (Xi, Yi) (where i=1,2,3, . . . ,n and n is the number of defects found) is determined according to its relative X and Y position in the default coordinate system 310 of the inspection machine and stored in a storage device 119. The photomask 200 is then removed from the inspection machine 110 and mounted in a repair machine 130. The locations of the defects found are transferred to a storage device 137 connected to or part of the repair machine 130. The operator then attempts to find the defects which were identified on the inspection machine 110 by applying the location information in the context of the default coordinate system 330 of the repair system 130. The calibration between the inspection machine 110 and repair machine 130, however, is dependent upon the accurate recording of the origin of the coordinate system 310 on the inspection machine 110 and the positioning of the photomask 200 in each of the machines. This leaves substantial room for variance, making it difficult and time-consuming for the repair machine operator to locate and repair the defects found in the photomask 200.

According to one embodiment of the present invention a test pattern 220 is included in photomask 200. When photomask 200 is mounted in the inspection machine 110 the test pattern is automatically searched, the stage 115 holding photomask 200 is driven to position (Xp, Yp) 320, and the locations of the test pattern and defects are recorded in the default coordinate system. The coordinate system of the inspection system is then reinitialized such that position (Xp, Yp) 320 is the reference point or origin of adjusted coordinate system 325. The location of each defect is measured in terms of adjusted coordinate system 325 and recorded. Photomask 200 is then removed from the inspection machine 110 and mounted in the repair machine 130. On the repair machine 130, the first step is to drive the stage 135 holding photomask 200' to test pattern 220 at position (Xp', Yp') 340 and initialize the coordinate system of the repair machine such that position (Yp', Yp') 340 is the reference point or origin of adjusted coordinate system 345. Adjusted coordinate system 345 is then used to locate the defects (Xi', Yi') 335 by applying the positions recorded on the adjusted inspection system coordinate system 325. As a result any variations between the coordinate systems of the individual machines resulting from errors in recording the origin or in how the photomask 200 is mounted in either machine do not impact the ability to locate the defects on the repair machine 130, and the relative context of defect locations 335 to the reference point 340 is preserved. Each defect is easily found, with no need to transform or convert location coordinates, as a result of the coordinate system for each machine being initialized to the same point.

Figure 4B:
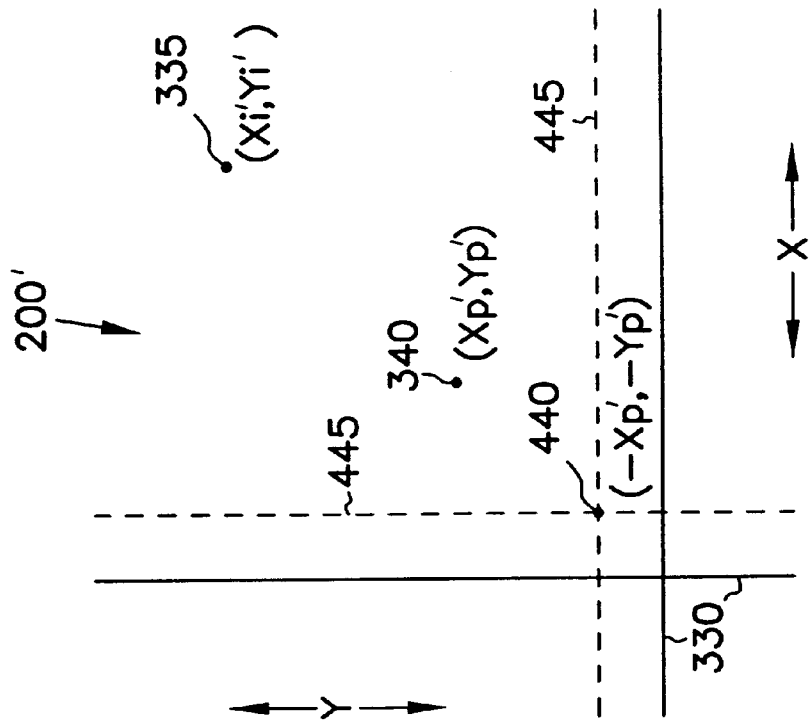
FIG. 4B is a graphical representation of the positioning of a photomask within the coordinate system of a repair machine according to another embodiment of the present invention.
Figure 4A:
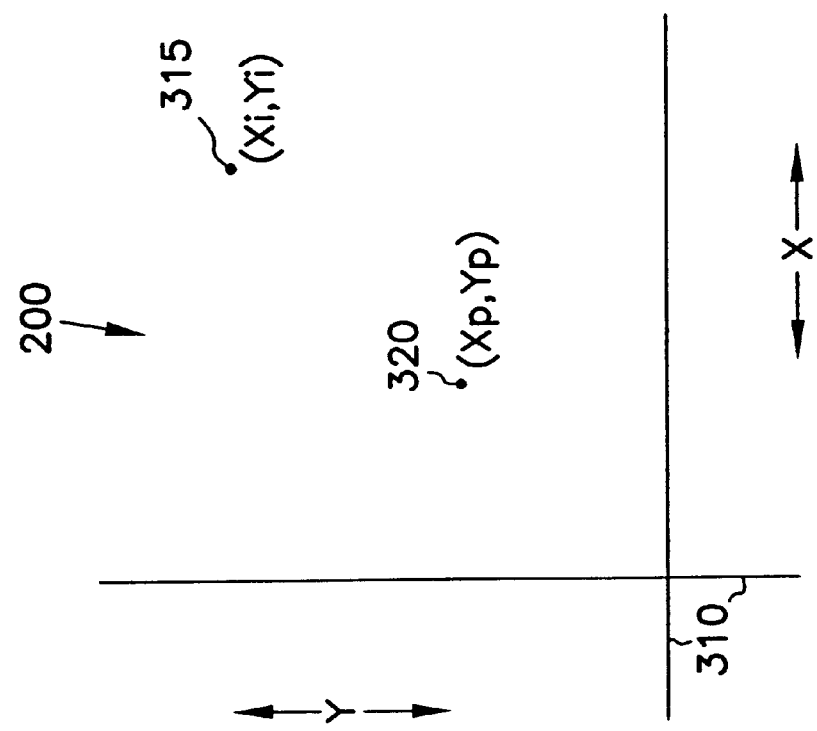
FIG. 4A is a graphical representation of the positioning of a photomask within the coordinate system of an inspection machine according to another embodiment of the present invention.

In an alternate embodiment of the present invention, shown in FIG. 4, test pattern 220 is located at a known position 320 on photomask 200. Photomask 200 is then mounted on the inspection machine 110. The photomask is inspected in the coordinate system 310. The location of test pattern 220 is recorded as (Xp, Yp) 320, and the defect locations are recorded as (Xi, Yi) 315 in the coordinate system 310. Photomask 200 is then removed from the inspection machine 110 and mounted in the repair machine 130. The stage 135 holding photomask 200' is driven to the center of test pattern 220 at point (Xp', Yp') 340, and the coordinate system of the repair machine 130 is initialized. The stage 135 is then moved to position (—Xp',—Yp') 440, placing the stage 135 at a second reference point which is the origin of adjusted coordinate system 445. The repair machine 130 can then drive the stage 135 directly to each defect (Xi', Yi') 335 according to the location recorded on the inspection machine 110 and now stored in storage device 137. This process operates to remove any errors introduced to the location of the origin of the coordinate system 310.

Figure 5B:
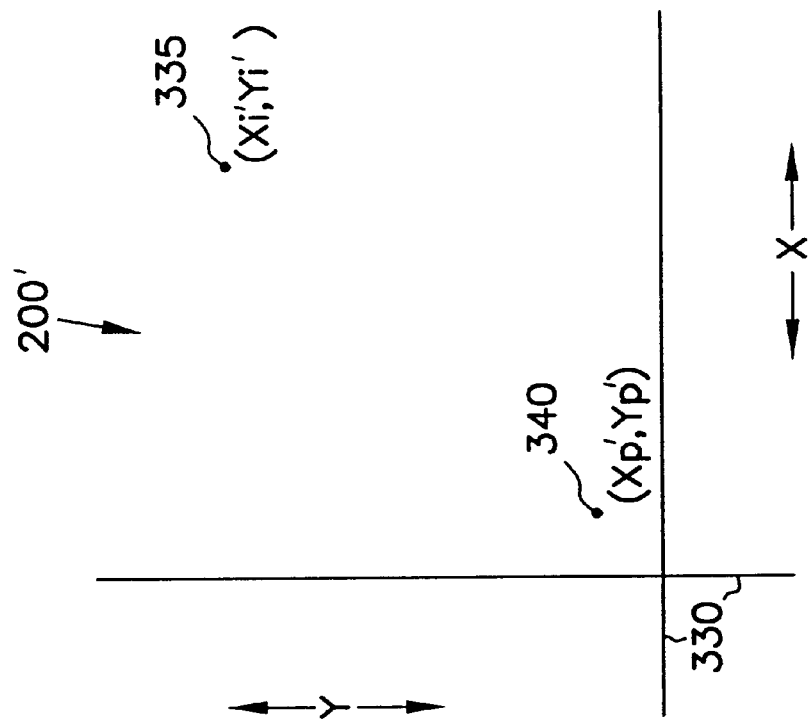
FIG. 5B is a graphical representation of the positioning of a photomask within the coordinate system of a repair machine according to yet another embodiment of the present invention.
Figure 5A:
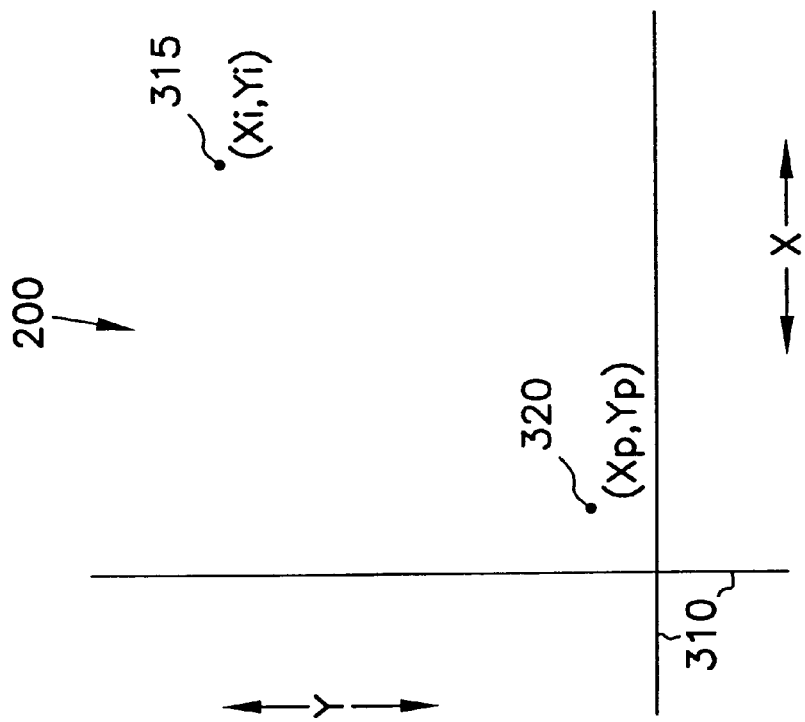
FIG. 5A is a graphical representation of the positioning of a photomask within the coordinate system of an inspection machine.

FIG. 5 illustrates yet another embodiment of the present invention. Test pattern 220 is located at a known position on photomask 200. Photomask 200 is then mounted on the inspection machine 110, stage 115 holding photomask 200 is driven to the center of test pattern 220, and the location in the default coordinate system 310 is recorded. As shown in FIG. 5A, the center of test pattern 220 is recorded as (Xp, Yp) 320. Each defect (Xi, Yi) 315 is located according to its relative X and Y location within the coordinate system 310 of the inspection machine 110. After inspection is complete and the locations of each defect found are stored in storage device 119, photomask 200 is removed from the inspection machine 110 and mounted in the repair machine 130. The stage 135 holding photomask 200 is driven to the center of test pattern 220, and the coordinate system of the repair machine 130 is adjusted such that location (Xp', Yp') 340 of the coordinate system 330 of the repair machine is at the center of test pattern 220. Each defect (Xi', Yi') 335 is then located using the coordinate system 330 of the repair machine 130 according to the relative locations recorded on the inspection machine 110.

The above examples are offered for illustration and are not intended to be exclusive or limiting. One skilled in the art will readily recognize that the described method and apparatus can be employed to correlate the coordinate systems of any two or more mask processing machines. Additional features are added to the embodiments to increase the effectiveness of the method of the present invention. In one example, repair testers employ test pattern 220 to characterize the functions of the repair system before the actual repair, such as alignment accuracy or etching and deposition rate. In another example, phase-shifting, transmission and CD monitors use the method of the present invention for calibration validation during the mask process and incoming inspection. These illustrations are exemplary in nature and not intended to be exclusive or limiting.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

We claim:

1. A photomask, comprising:

a productive area comprising a mask pattern;

a nonproductive area adjacent to but separate from the productive area, the nonproductive area comprising one or more test patterns; and one or more reference points located and clearly identifiable within each of the one or more test patterns.

2. The photomask of claim 1, wherein each of the one or more reference points is positioned at a predetermined location.

3. A photomask, comprising:

a first area comprising a mask pattern;

a second area in proximity of the first area;

at least one test pattern located within the second area;

at least one reference point located within at least one of the test patterns; and wherein at least one of the reference points is a correlation point for establishing a new coordinate system.

4. The photomask of claim 3, wherein at least one of the reference points is positioned at a predetermined location.

5. The photomask of claim 3, wherein at least one of the reference points is an origin point of a coordinate system.

6. The photomask of claim 3, wherein at least one of the reference points is a calibration point for correcting a coordinate system.

7. The photomask of claim 3, wherein at least one of the test patterns comprising multiple reference points which are used in conjunction with each other to more accurately calibrate an existing coordinate system.

8. The photomask of claim 3, wherein at least one of the reference points is a common point for metrologic tasks on mask inspection and repair machines.

9. A photomask, comprising:

a first area comprising a mask pattern;

a second area in proximity of the first area;

at least one test pattern located within the second area; and at least one reference point located within at least one of the test patterns and at least one of the reference points being a common reference point for relating a first coordinate system to a second coordinate system.

10. The photomask of claim 9, wherein at least one of the reference points is positioned at a predetermined location.

11. The photomask of claim 9, wherein the first coordinate system is a mask inspection machine coordinate system.

12. The photomask of claim 9, wherein the second coordinate system is a mask repair machine coordinate system.

13. The photomask of claim 9, wherein at least one of the reference points is an origin point for both the first and second coordinate systems.

14. The photomask of claim 9, wherein at least one of the reference points is a correlation point for relating the second coordinate system to the first coordinate system such that defects can be found in the second coordinate system using coordinates from the first coordinate system.

15. The photomask of claim 9, wherein at least one of the reference points is a calibration point for correcting the first and second coordinate systems such that defects can be found in both systems using common coordinates.

16. The photomask of claim 9, wherein at least one of the test patterns comprising multiple reference points which are used in conjunction with each other to more accurately calibrate the first and second coordinate systems.

17. A photomask, comprising:

a productive area comprising a mask pattern;

a nonproductive area adjacent to the productive area;

at least one test pattern located within the nonproductive area; and at least one reference point located within at least one of the test patterns and at least one of the reference points being a correlation point for relating a mask inspection machine coordinate system to a mask repair machine coordinate system.

18. The photomask of claim 17, wherein at least one of the test patterns comprising intersecting lines with an intersection point.

19. The photomask of claim 18, wherein at least one of the reference points is the intersection point.

20. The photomask of claim 17, wherein at least one of the test patterns comprising concentric circles with a center point.

21. The photomask of claim 20, wherein at least one of the reference points is the center point.

22. The photomask of claim 17, wherein at least one of the test patterns comprising a known defect with a center point.

23. The photomask of claim 22, wherein at least one of the reference points is the center point.

\* \* \* \* \*